(12) United States Patent
Jensen et al.

(10) Patent No.: US 10,455,731 B2
(45) Date of Patent: Oct. 22, 2019

(54) HYDRAULIC BLADDER FOR CPU INTERCONNECTION AND COOLING

(71) Applicant: Intel Corporation, Santa Clara, CA (US)

(72) Inventors: Ralph W. Jensen, Hillsboro, OR (US); Jeffory L. Smalley, Olympia, WA (US); Kevin J. Ceurter, Olympia, WA (US); Devdatta P. Kulkarni, Portland, OR (US); Casey Winkel, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/457,446

(22) Filed: Mar. 13, 2017

(65) Prior Publication Data

US 2018/0263137 A1    Sep. 13, 2018

(51) Int. Cl.
*H05K 7/20* (2006.01)
*G06F 1/20* (2006.01)
*H01L 23/473* (2006.01)
*H01L 25/10* (2006.01)
*H01L 23/40* (2006.01)

(52) U.S. Cl.
CPC ......... *H05K 7/20254* (2013.01); *G06F 1/20* (2013.01); *H01L 23/473* (2013.01); *H01L 25/105* (2013.01); *H05K 7/20772* (2013.01); *G06F 2200/201* (2013.01); *H01L 23/4006* (2013.01)

(58) Field of Classification Search
CPC .......... H05K 7/20263; H05K 7/20409; H05K 7/2049; H01L 23/367; H01R 12/7076
See application file for complete search history.

(56) References Cited

U.S. PATENT DOCUMENTS

| 6,212,074 | B1* | 4/2001 | Gonsalves | .......... H01L 23/4006 |
| | | | | 165/185 |
| 2002/0036890 | A1* | 3/2002 | Furuya | .................. H01L 23/427 |
| | | | | 361/702 |
| 2010/0039770 | A1* | 2/2010 | Danello | ............... H05K 7/2049 |
| | | | | 361/691 |
| 2017/0186667 | A1* | 6/2017 | Choudhury | ........... H01L 23/473 |
| 2018/0098458 | A1* | 4/2018 | Chainer | ............. H05K 7/20254 |

\* cited by examiner

*Primary Examiner* — Mukundbhai G Patel
*Assistant Examiner* — Zhengfu J Feng
(74) *Attorney, Agent, or Firm* — Schwabe, Williamson & Wyatt, P.C.

(57) ABSTRACT

Embodiments herein relate to hydraulic bladders to provide a force against an integrated circuit package to be located between the hydraulic bladder and a system board. In various embodiments, a hydraulic force generator may include a block to be coupled with a system board and a hydraulic bladder to be located between the block and the system board, where the hydraulic bladder, in response to pressurization, is to provide a force against an integrated circuit package to be located between the hydraulic bladder and the system board. Other embodiments may be described and/or claimed.

18 Claims, 8 Drawing Sheets

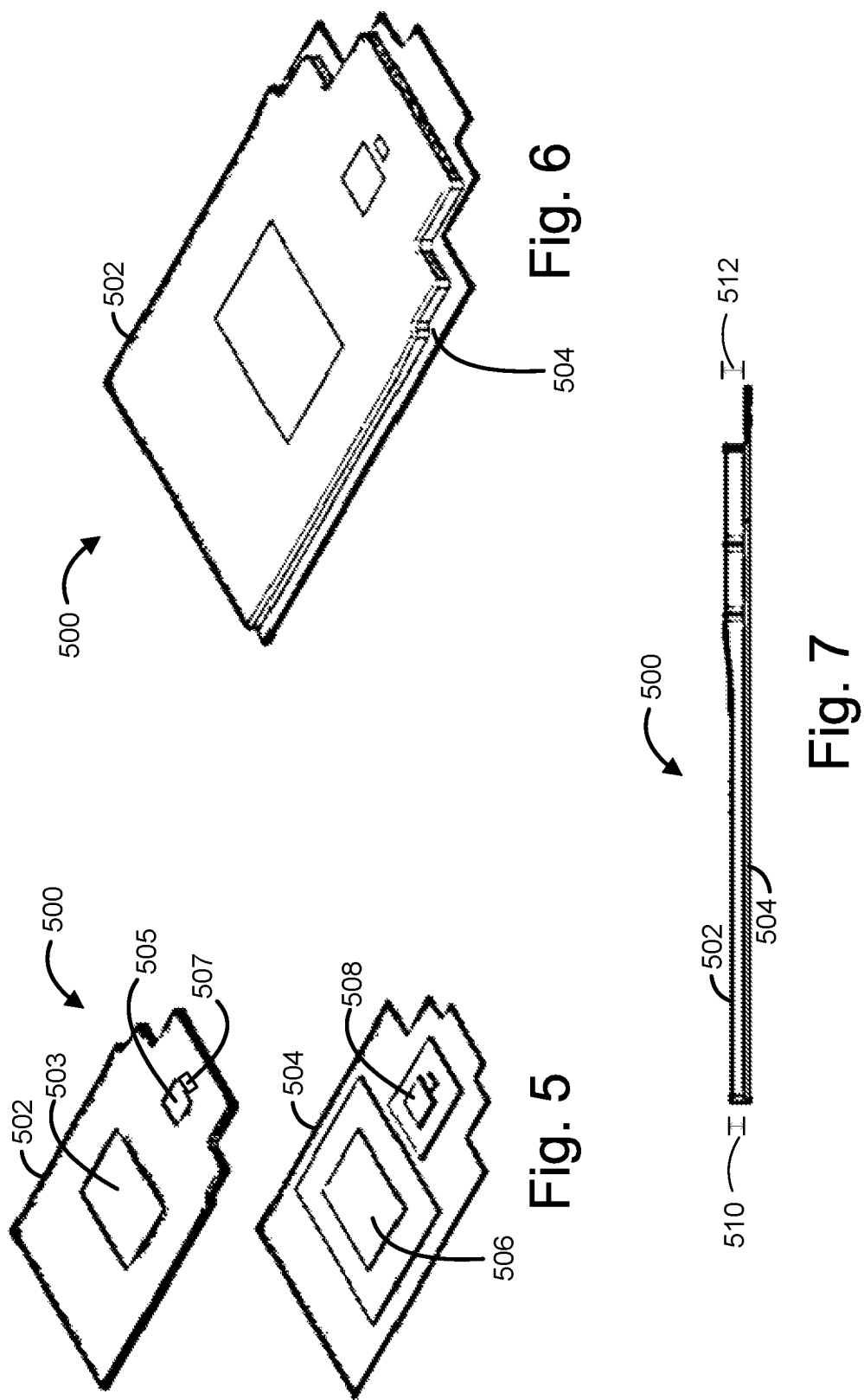

Section A-A

HYDRAULIC BLADDER FOR CPU INTERCONNECTION AND COOLING

FIELD

Embodiments of the present disclosure generally relate to the fields of computer and electronic systems, and, more particularly, to force generators to maintain a connection between integrated circuit packages and associated connectors in these systems.

BACKGROUND

In many computer, electronic and like systems, a system board may include one or more sockets to receive one or more central processing units (CPUs) and/or other integrated circuit (IC) packages. In some legacy systems, a CPU or other IC package is held in place against the socket by bolting a heat sink to a loading assembly. This technique can present a number of disadvantages including variable socket forces, slow assembly time, requirement for thermal interface material (TIM), significant material weight and cost, and/or significant planar space requirements and z-height requirements.

BRIEF DESCRIPTION OF THE DRAWINGS

Embodiments of the hydraulic bladders and/or hydraulic force generators of the present disclosure may overcome these limitations. The techniques will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 5 is a diagram illustrating an exploded view of an overlay assembly having an overlay heat spreader plate and an associated multi-chip package, according to various embodiments.

FIG. 6 is a diagram illustrating the overlay assembly of FIG. 5 showing the overlay heat spreader plate coupled with the multi-chip package, according to various embodiments.

FIG. 7 is a diagram illustrating a side view of the overlay assembly of FIG. 6, according to various embodiments.

DETAILED DESCRIPTION

Figure 1:
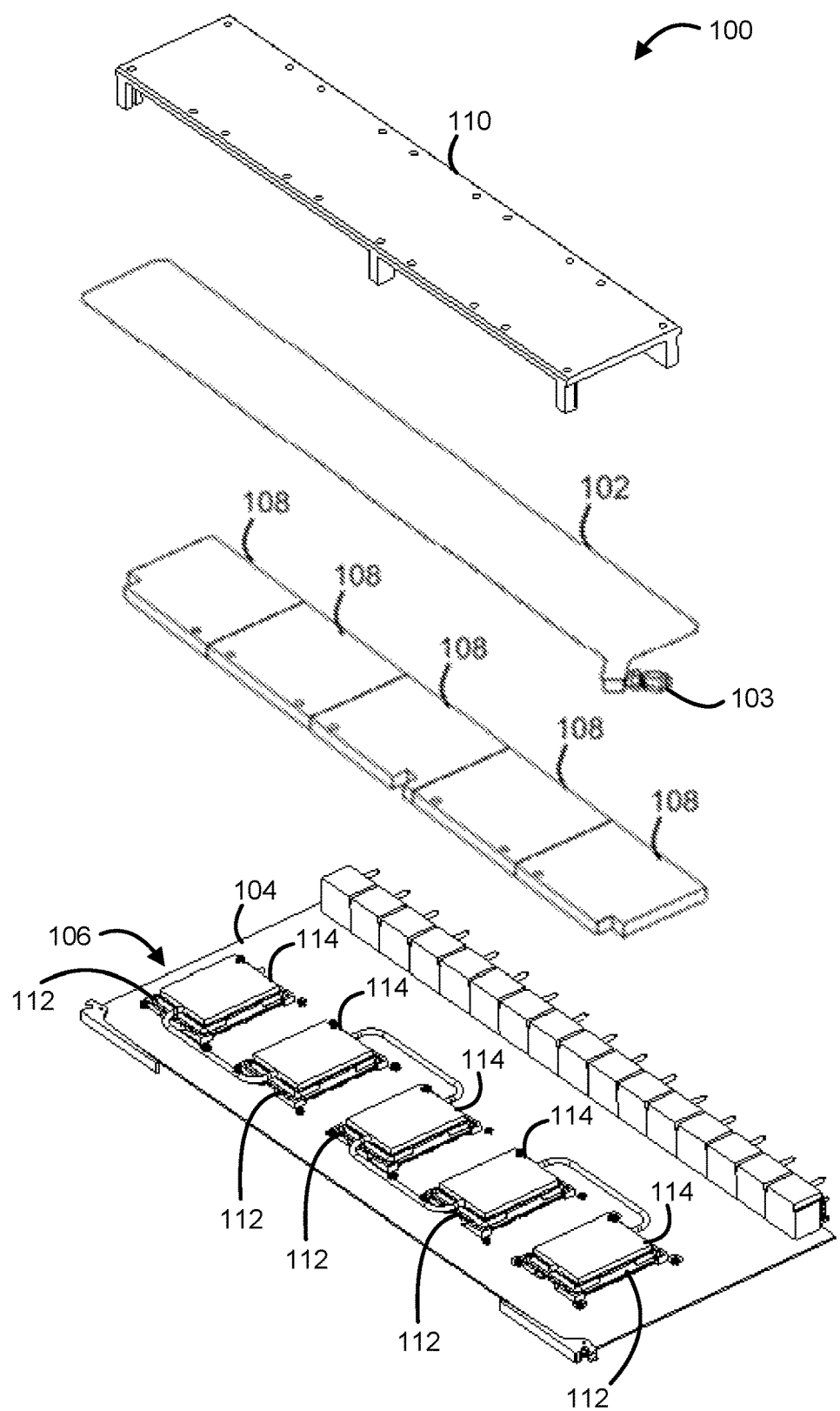
FIG. 1 is a diagram illustrating an exploded view of a switch board layer with a hydraulic bladder, according to various embodiments.

Embodiments of the present disclosure describe hydraulic force generators and hydraulic bladders to provide a force against an integrated circuit (IC) package and a system board. In various embodiments, a hydraulic force generator may include a block to be coupled with a system board and a hydraulic bladder to be located between the block and the system board, where the hydraulic bladder, in response to pressurization, is to provide a force against an IC package to be located between the hydraulic bladder and the system board.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. It will be apparent to one skilled in the art that embodiments of the present disclosure may be practiced without the specific details. In other instances, well-known features may be omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

FIG. 1 is a diagram illustrating an exploded view of a switch board layer 100 with a hydraulic bladder 102 that may have a hydraulic fitting 103, according to various embodiments. In some embodiments, the switch board layer 100 may be included in a stacked cluster computing system as described with respect to FIG. 4. In some embodiments, the switch board layer may include a system board 104, one or more IC complexes 106 coupled with the system board 104, one or more lower blocks 108 that may be positioned adjacent to the one or more IC complexes 106, and an upper block 110. In some embodiments, the lower blocks 108 may be spacers and/or the upper block 110 may be a plate that may have one or more protrusions extending therefrom that may be used to mount the upper block 110 to the system board 104 and/or may provide for a fixed distance between an interior surface of the upper block 110 and the system board 104 when the upper block 110 is fastened to the system board 104. In various embodiments, the lower blocks 108 and/or the upper block 110 may be formed of metal or some other heat conductive material. In other embodiments, the lower blocks 108 and/or the upper block 110 may be formed of a non-metallic material. In various embodiments, each of the IC complexes 106 may include a socket 112 and an IC package 114 coupled with the socket 112. In various embodiments, the IC complexes 106 may be any kind of processor (e.g., central processing unit (CPU), a graphics processing unit (GPU) processor that may be used for general-purpose computing on GPUs (GPGPU), a field programmable gate array (FPGA), and/or an application specific integrated circuit (ASIC)) and the IC packages 114 may include any kind of processor. As shown, in various embodiments, the switch board layer 100 may include five CPU complexes as the IC complexes 106 with a corresponding five lower blocks 108. In some embodiments, one or more of the one or more lower blocks 108 may not be present, with the hydraulic bladder 102 to directly contact one or more of the IC complexes 106 where lower blocks 108 are not present. In some embodiments, a lower block 108 may extend across more than one of the IC complexes 106 rather than being only over a single IC complex 106. In embodiments, a single lower block 108 may be used that extends across some or all of the IC complexes 106. In some embodiments, more than one upper block 110 may be used. In embodiments, an upper block 110 may not be present, and an upper surface of the hydraulic bladder 102 may be positioned adjacent to a different rigid surface such as a lower side of another system board when the switch board layer 100 is used as an internal layer in a stacked configuration.

In various embodiments, the hydraulic bladder 102, the upper block 110, and the lower blocks 108 may be a hydraulic force generator, with the hydraulic bladder 102, in response to pressurization, to provide a force against the IC packages 114. In some embodiments, the hydraulic force generator may include the hydraulic bladder 102 but may not include one or more of the other components (e.g., lower blocks 108 and/or upper block 110). The hydraulic force generator may also be referred to as a hydraulic bladder assembly, and the terms may be synonymous in some embodiments. In various embodiments, a single hydraulic bladder 102 may be used, with corresponding regions of the hydraulic bladder 102 positioned between each of the lower blocks 108 and the upper block 110 to provide a force against the IC packages 114 located between the lower blocks 108 and the sockets 112. In some embodiments, more than one hydraulic bladder may be used.

Figure 2:
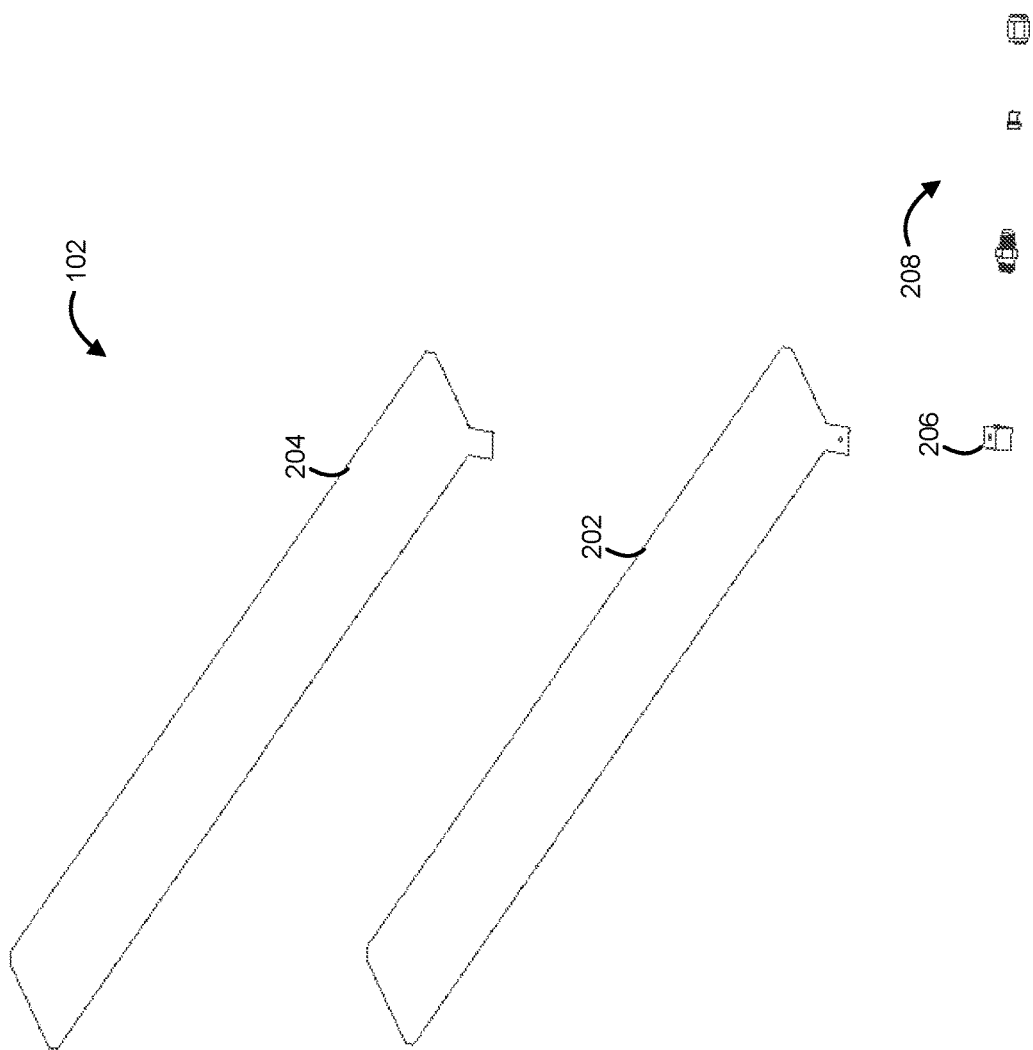
FIG. 2 is a diagram showing an exploded view of the hydraulic bladder of FIG. 1, according to various embodiments.

FIG. 2 is a diagram showing an exploded view of the hydraulic bladder 102 of FIG. 1, according to various embodiments. In some embodiments, the hydraulic bladder 102 may include a lower skin 202 and an upper skin 204 that may be joined, e.g., double welded, to the lower skin 204. In various embodiments, a fitting block 206 may be joined, e.g., welded, to the lower skin 202 and/or the upper skin 204. In some embodiments, one or more hydraulic fittings 208 may be coupled with the fitting block 206. In embodiments, one or more of the hydraulic fittings may correspond to the hydraulic fitting 103 shown in FIG. 1. In various embodiments, the lower skin 202 and/or the upper skin 204 may be formed of stainless steel, copper, aluminum, or any other suitable material. In some embodiments, the lower skin 202 and/or the upper skin 204 may have a thickness less than or equal to approximately 0.005 inches, and in some embodiments may have a thickness of approximately 0.003 inches. However, it should be understood that the lower skin 202 and the upper skin 204 may have any suitable thickness in various embodiments.

Figure 3:
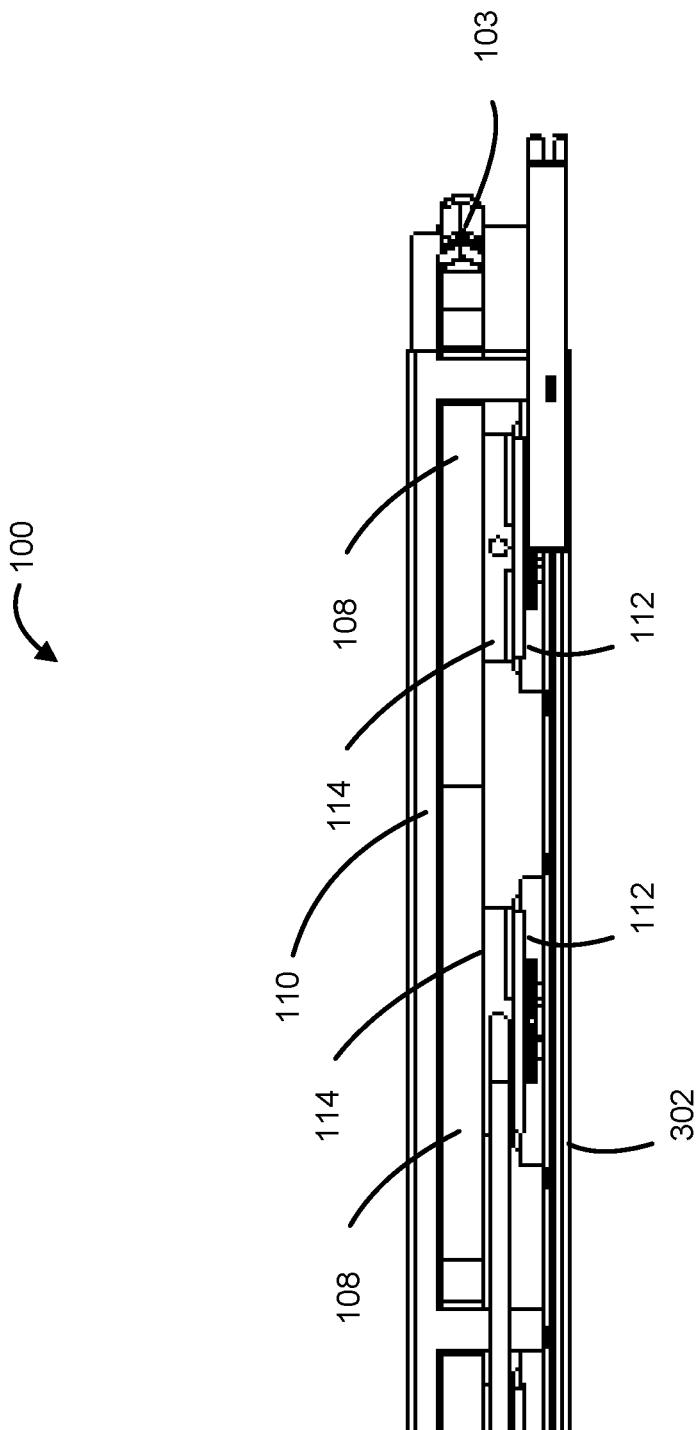
FIG. 3 is a diagram illustrating a side view of a portion of the switch board layer of FIG. 1, according to various embodiments.

FIG. 3 is a diagram illustrating a side view of a portion of the switch board layer 100, according to various embodiments. The hydraulic bladder 102 may be obscured by some of the other components according to some embodiments and is not labeled for clarity. In some embodiments, the upper block 110 may not be present for some switch board layers such as when a switch board layer may be positioned adjacent to another switch board layer in a stacked configuration such that an upper surface of the hydraulic bladder 102 is positioned adjacent to a lower surface of a system board (e.g., a lower surface 302 of the system board 104) which may serve a similar function to the upper block 110 such that the hydraulic bladder 102 may provide a force against an IC package on the adjacent switch board layer in response to pressurization.

Figure 4:
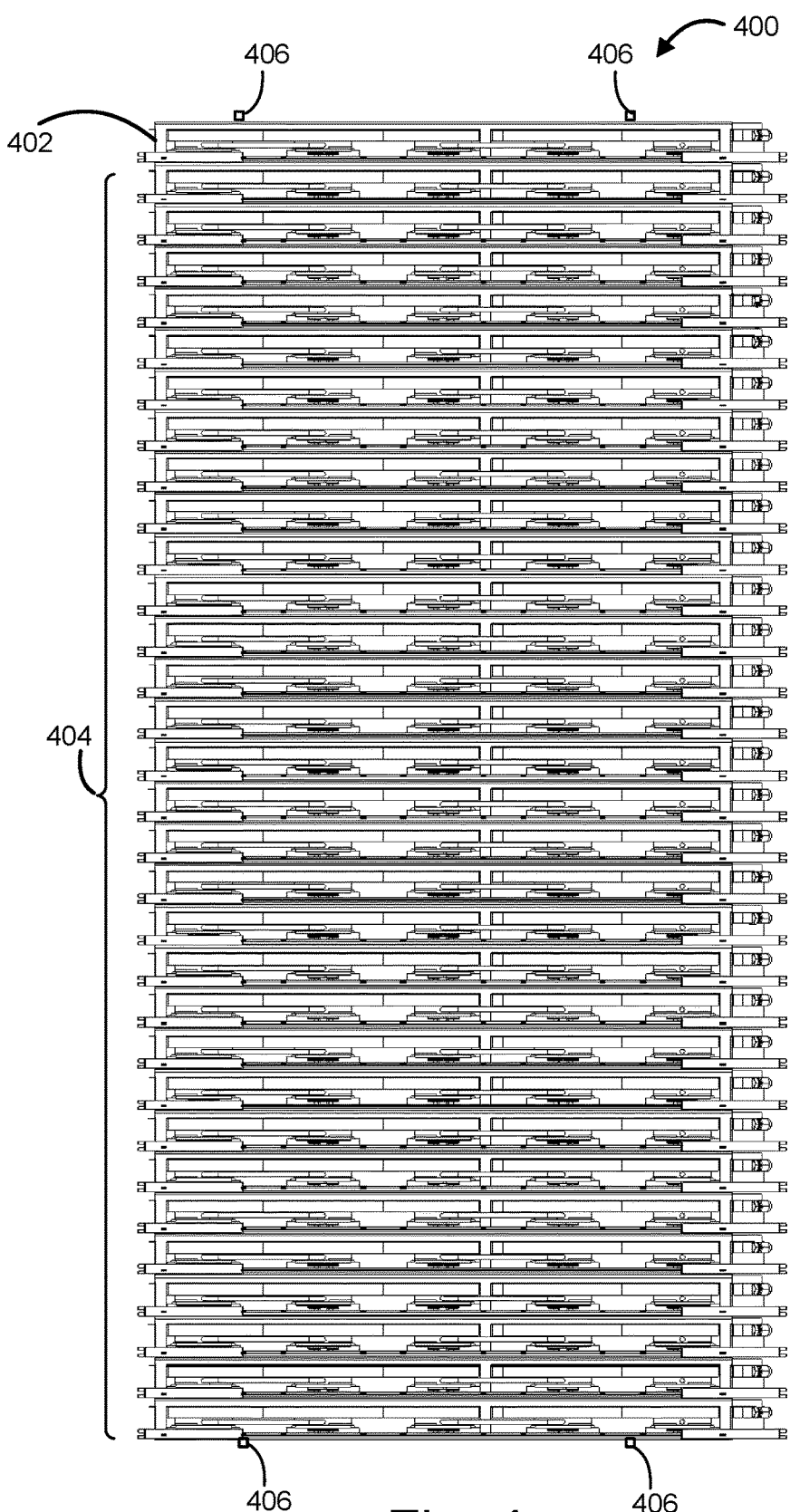
FIG. 4 is a diagram illustrating a stacked cluster computing system having a plurality of switch board layers with hydraulic bladders, according to various embodiments.

FIG. 4 is a diagram illustrating a stacked cluster computing system 400 having a plurality of switch board layers with hydraulic bladders, according to various embodiments. In some embodiments, a top switch board layer 402 may be structured in similar fashion to the switch board layer 100 described with respect to FIGS. 1-3 and may include an upper block corresponding to the upper block 110. In various embodiments, the stacked cluster computing system 400 may include one or more additional switch board layers 404 that may be structured in similar fashion to the switch board layer 100, but without the upper block 110, as described with respect to FIG. 3. In embodiments, the stacked cluster computing system 400 may have thirty-two switch board layers, but any suitable number of layers may be included in various embodiments. In some embodiments, one or more internal switch board layers may include the upper block 110 in a system with a stacked configuration rather than using a lower surface of the system board of an adjacent switch board layer. In various embodiments, one or more fasteners 406 (e.g., bolts or any other suitable fastener) may extend through all of the switch board layers in the stacked cluster computing system 400. In some embodiments, one or more of the fasteners 406 may extend through some, but not all of the switch board layers. In some embodiments, the fasteners 406 may clamp the switch board layers of the stacked cluster computing system 400 together to hold the stacked cluster together. In various embodiments, the space consumed by the hydraulic bladder 102 and associated components (e.g., lower blocks 108, fasteners 406) on a top side of the system board 104 may be significantly less than that used in legacy independent loading mechanism (ILM) approaches which may improve top side usable component space adjacent to CPUs in comparison to legacy approaches. In various embodiments, the stacked cluster computing system 400 may not use a bolster plate on a lower surface of one or more of the switch board layers 402 and/or 404, which may improve usable space on a lower side of the system board 104 in comparison to legacy approaches.

FIG. 5 is a diagram illustrating an exploded view of an overlay assembly 500 having an overlay heat spreader plate 502 and an associated multi-chip package (MCP) 504, according to various embodiments. In embodiments, the overlay heat spreader plate 502 may be a cast-machined aluminum overlay. In various embodiments, the overlay heat spreader plate 502 may include a first cavity 503, a second cavity 505, and a third cavity 507. In some embodiments, the MCP 504 may include a CPU 506 and one or more additional ICs, such as network interconnect fabric ICs 508. In various embodiments, the overlay heat spreader plate 502 may be assembled onto the MCP 504 instead of an integrated heat spreader (IHS) cap. In some embodiments, IC dies on the MCP 504 may be located within the cavities of the overlay heat spreader plate 502 when the overlay heat spreader plate 502 is assembled onto the MCP 504. In various embodiments, the CPU 506 may be located within the first cavity 503, a first one of the network interconnect fabric ICs 508 may be located within the second cavity 505, and a second one of the network interconnect fabric ICs 508 may be located within the third cavity 507. The overlay heat spreader plate 502 may include a different number of cavities in some embodiments.

In some embodiments, during assembly of the overlay heat spreader plate 502 and the MCP 504, the tops of the silicon dies (e.g., CPU 506, network interconnect fabric ICs 508) in the MCP 504 may be covered with tape before an underfill is applied, the underfill may be applied, the overlay heat spreader plate 502 may be pressed into place, excess underfill may be cleaned up, and the underfill may be cured. In various embodiments, the tape may then be removed and excess residue may be cleaned. Although the overlay heat spreader plate 502 is shown in conjunction with MCP 504, it should be understood that the overlay heat spreader plate 502 may be used with an IC package having a single die in some embodiments, or may be used with multiple single or multi-chip packages.

FIG. 6 is a diagram illustrating the overlay assembly 500 of FIG. 5 showing the overlay heat spreader plate 502 coupled with the multi-chip package 504, according to various embodiments. FIG. 7 is a diagram illustrating a side view of the overlay assembly 500 of FIG. 6, according to various embodiments. In some embodiments, IC dies in the MCP 504 may have different heights. In various embodiments, the CPU 506 may have a first height 510 and the network interconnect fabric ICs 508 may have a second height 512 different than the first height. In embodiments, the first and second heights may be orthogonal to a system board (e.g., system board 606 of FIGS. 8-10) when the overlay assembly 500 is assembled into a computer system. In various embodiments, the overlay heat spreader plate 502 may have first thickness in a region around the first cavity 503 and a second thickness in a region around the second and third cavities 505, 507. In embodiments, the first thickness in the region around the first cavity 503 may correspond to and/or be the same as the first height 510 of the CPU 506 such that a top surface of the CPU may be flush with the overlay heat spreader plate 502 when assembled. In embodiments, the second thickness in the region around the second and third cavities 505, 507 may correspond to and/or be the same as the second height 512 of the network interconnect fabric ICs 508 such that the top surfaces of the network interconnect fabric ICs 508 may be flush with the overlay heat spreader plate 502 when assembled. In some embodiments, the overlay heat spreader plate 502 may transition smoothly from the first thickness to the second thickness.

Figure 8:
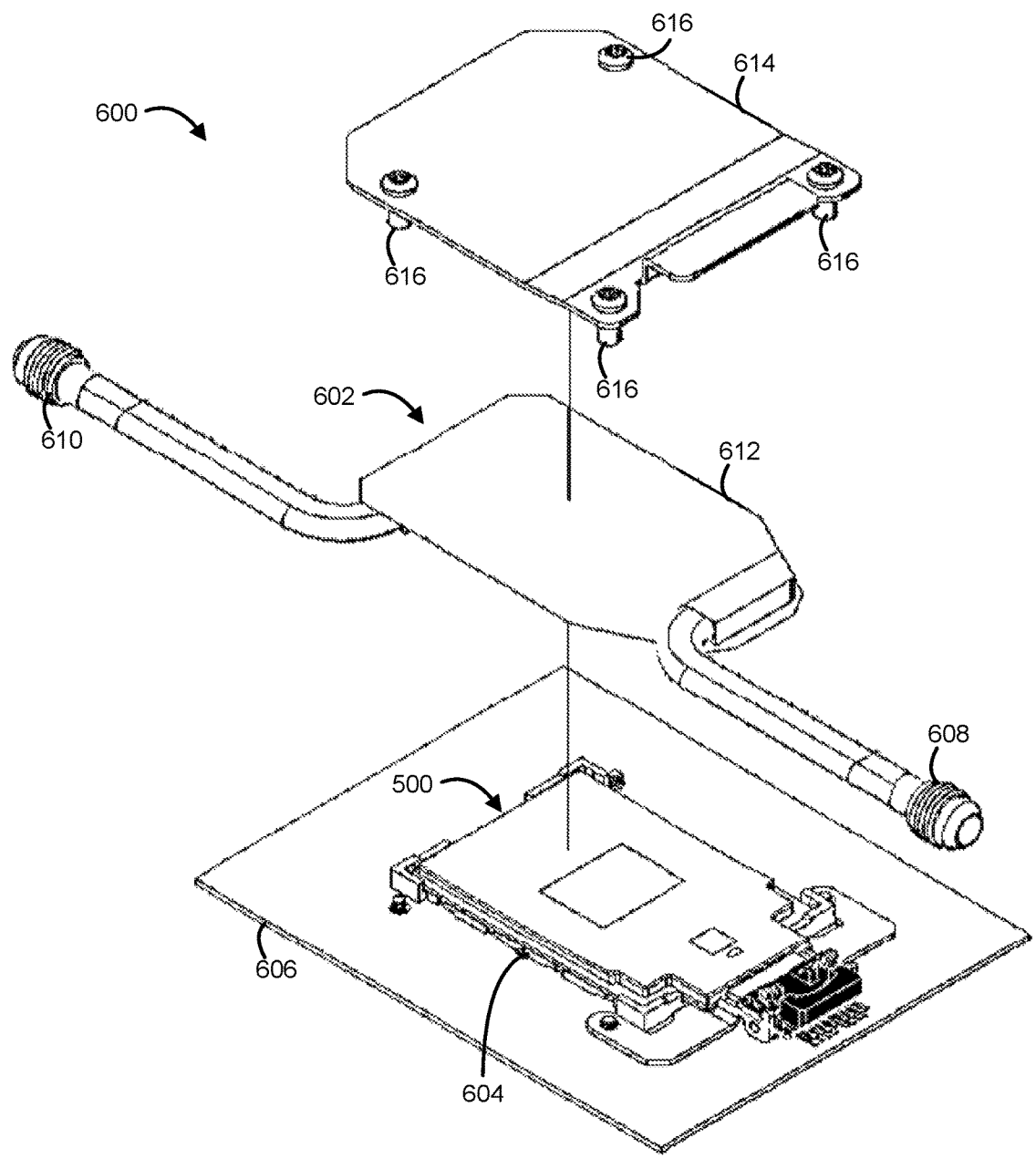
FIG. 8 is a diagram illustrating an exploded view of a computer system including the overlay assembly of FIG. 6 and a hydraulic bladder assembly, according to various embodiments.
Figure 9:
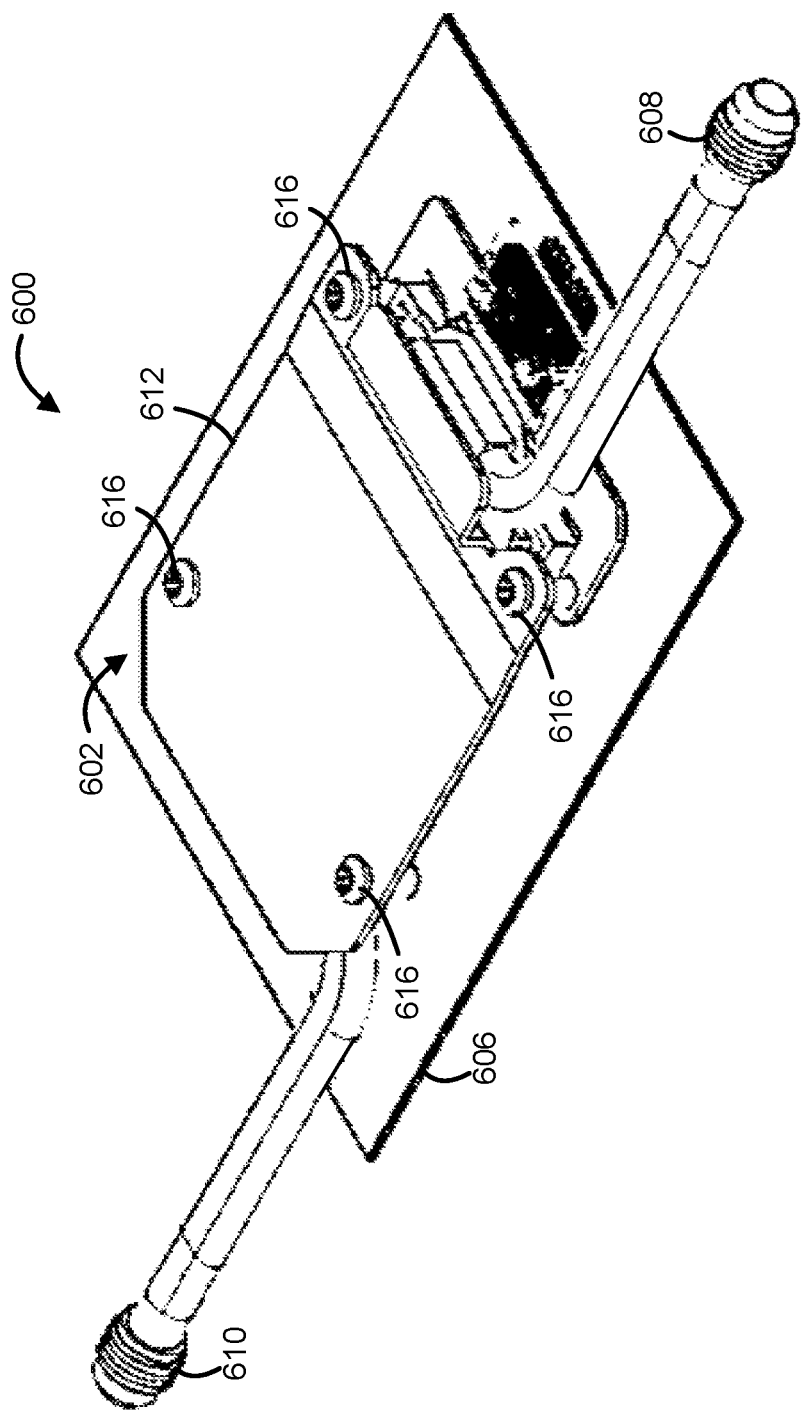
FIG. 9 is a diagram illustrating an assembled view of the computer system of FIG. 8, according to various embodiments.

FIG. 8 is a diagram illustrating an exploded view of a computer system 600 including the overlay assembly 500 of FIG. 6 and a hydraulic bladder assembly 602, according to various embodiments. In some embodiments, the overlay assembly 500 may be coupled with a socket 604 on a system board 606. In embodiments, the MCP 504 may have a plurality of interconnects (not shown for clarity) to be coupled with the socket 604. In various embodiments, the hydraulic bladder assembly 602 may include a first hydraulic fitting 608 and a second hydraulic fitting 610 coupled with a hydraulic bladder 612, where the first and second hydraulic fittings 608 and 610 are to be coupled to a pressurized liquid cooling system. In some embodiments, one of the first hydraulic fitting 608 and the second hydraulic fitting 610 may serve as a fluid inlet and the other may serve as a fluid outlet and may allow coolant from the pressurized liquid cooling system to flow through the hydraulic bladder assembly 602. In various embodiments, the hydraulic bladder assembly 602 may be coupled between the overlay assembly 500 and a top plate 614. In some embodiments, the top plate 614 may be coupled with the system board 606 with a plurality of fasteners 616. FIG. 9 is a diagram illustrating an assembled view of the computer system 600 of FIG. 8, according to various embodiments.

Figure 10:
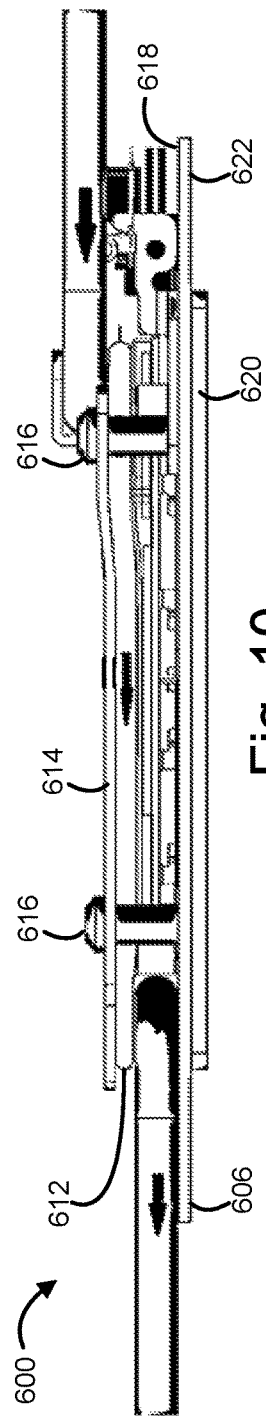
FIG. 10 is a diagram illustrating a partial side view of the computer system of FIG. 9, according to various embodiments.

FIG. 10 is a diagram illustrating a partial side view of the computer system 600 of FIG. 9 with arrows indicating a direction of coolant flow, according to various embodiments. In some embodiments, the top plate 614 may be coupled with a first side 618 of the system board 606 by passing the fasteners 616 through the system board 606 and attaching the fasteners 616 to a bolster plate 620 on a second side 622 of the system board 606 opposite the first side 618, attachment to bolster plate 620 not shown for clarity. In various embodiments, a constant static pressure of approximately 30 pounds per square inch (psi) may be maintained in the hydraulic bladder 612 by a pressure regulating accumulator, not shown for clarity. In some embodiments, the hydraulic bladder 612 may provide a force against a first side of the MCP 504 such that a compressive force is maintained between a second side of the MCP 504 and the socket 604.

Figure 11:
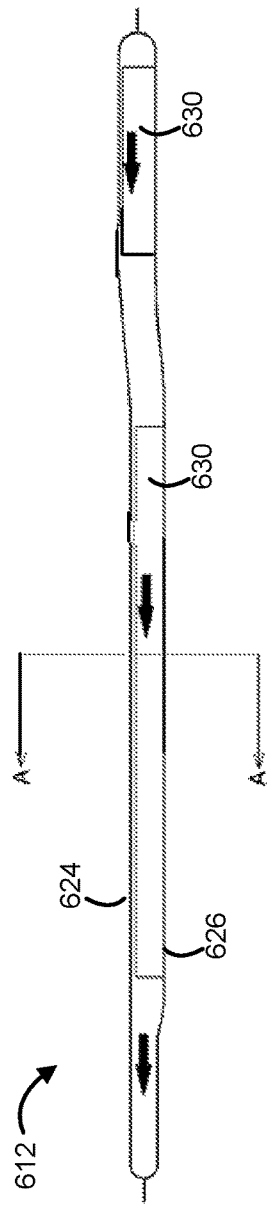
FIG. 11 is a diagram illustrating a side view of the hydraulic bladder of FIG. 10, according to various embodiments.

FIG. 11 is a diagram illustrating a side view of the hydraulic bladder 612 of FIG. 10, according to various embodiments. In some embodiments, the hydraulic bladder 612 may be formed of a metal such as copper and may include a highly flexible heat conductive material 630 inside the bladder to increase heat transfer to a fluid passing through the hydraulic bladder 612. In embodiments, the highly flexible heat conductive material 630 may increase interior surface area in the hydraulic bladder 612, thereby increasing heat transfer. In various embodiments, the hydraulic bladder 612 may include an upper skin 624 and a lower skin 626. In some embodiments, the upper skin 624 may be welded to the lower skin 626. In various embodiments, the upper skin 624 and the lower skin 636 may be formed of copper foil that may be approximately 0.003 inches in thickness, although any other suitable material and/or thickness may be used. In some embodiments, the hydraulic bladder 612 may have a maximum rupture pressure of approximately 704 psi. Although the hydraulic bladder 612 may be formed of copper in some embodiments, any other suitable material may be used in various embodiments.

Figure 12:
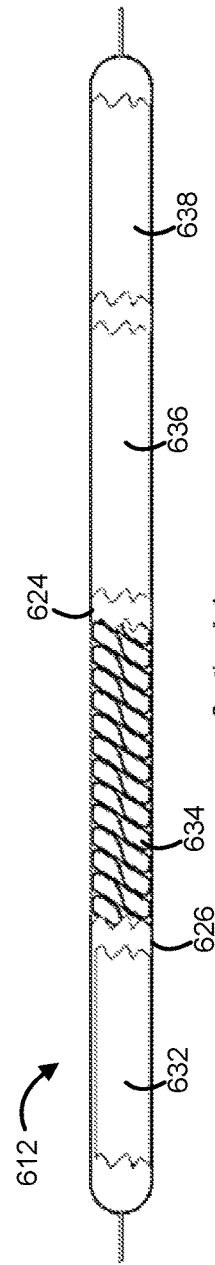
FIG. 12 is a diagram illustrating a cross section of the hydraulic bladder of FIG. 11, according to various embodiments.

FIG. 12 is a diagram illustrating a cross section of the hydraulic bladder 612 of FIG. 11, according to various embodiments. In various embodiments, the highly flexible heat conductive material 630 may include a metallic foam 632, a metallic foil 634, a metallic gauze 636, a metallic felt 638, and/or any other suitable flexible heat conductive material. In some embodiments, the metallic foam 632 may be attached to an interior surface of the bottom skin of the hydraulic bladder 612 and may strengthen the bladder skin while still allowing sufficient flexibility when needed such as for applications where the hydraulic bladder 612 extends across a surface that varies in height. In various embodiments, the metallic foil 634 may be attached to an interior surface of the hydraulic bladder 612. In some embodiments, the metallic foil 634 may be formed of a metal such as copper or aluminum. In various embodiments, the metallic foil 634 may be formed as thin micro fins that may be in a serpentine pattern. In some embodiments, the metallic foam 632 or the metallic foil 634 maybe segmented longitudinally for increased flexibility. Although the metallic foam 632, the metallic foil 634, the metallic gauze 636, and the metallic felt 638 are all shown for purposes of illustration, it should be understood that only one of these heat conductive materials or a subset of two or more of these flexible heat conductive materials may be present in some embodiments. The highly flexible heat conductive material 630 may be formed of copper, aluminum, or any other suitable material in various embodiments.

In various embodiments, the hydraulic bladders (e.g., hydraulic bladder 102, 302, and/or 612) and/or other components of FIGS. 1-4 and 8-12 may provide an even, precise, and reliable force generation mechanism for CPU sockets and/or other types of IC sockets in a highly compact manner that may be used in dense high performance computing (HPC) systems. In some embodiments, the pressure generated by the hydraulic bladders and/or other components may produce constant, easily monitored pressure. In embodiments, the even pressure field provided by the hydraulic bladders and/or other components may allow for a reduction in maximum applied forces which may enable extending a scaling limit of socket pin counts. In various embodiments, the hydraulic bladders and/or other components may allow for a denser HPC cluster than legacy approaches, closer CPU connections with shorter communication paths, and associated improvements to signal integrity (SI), power delivery, and performance. In some embodiments, the mass of the force generation device may be reduced in comparison to legacy approaches (e.g., bolted heat sinks) which may reduce dynamic loading (ship shock) which may improve system reliability. In embodiments, the hydraulic bladders and/or other components may provide for simpler and/or faster assembly and disassembly than legacy approaches using bolted heat sinks.

In some embodiments, the hydraulic bladder assembly 602 and/or other components of FIGS. 8-9 may provide socket connection forces in conjunction with liquid cooling, may have thinner walls than legacy cold plate cooling approaches resulting in less thermal resistance, lower weight, decreased cost, and may allow for a dry coupling connection to an IHS, overlay assembly, or other component rather than using a thermal interface material (TIM), which may reduce thermal impedance and/or increase reliability (e.g., legacy approaches using TIM may be subject to partial coverage, pump-out, and/or dry-out).

EXAMPLES

Example 1 may include a hydraulic force generator comprising: a block to be coupled with a system board; and a hydraulic bladder to be located between the block and the system board, wherein the hydraulic bladder, in response to pressurization, is to provide a force against an integrated circuit package located between the hydraulic bladder and the system board.

Example 2 may include the subject matter of Example 1, wherein the hydraulic bladder includes a first metal skin, a second metal skin coupled to the first metal skin, and a hydraulic fitting.

Example 3 may include the subject matter of Example 2, wherein one or more of the first metal skin and the second metal skin are formed of stainless steel, copper, or aluminum.

Example 4 may include the subject matter of any one of Examples 2-3, wherein the hydraulic fitting is a first hydraulic fitting and the hydraulic bladder includes a second hydraulic fitting, wherein the first hydraulic fitting and the second hydraulic fitting are to be coupled to a pressurized liquid cooling system.

Example 5 may include the subject matter of any one of Examples 1-4, wherein the hydraulic bladder includes a flexible heat conductive material inside the hydraulic bladder.

Example 6 may include the subject matter of Example 5, wherein the flexible heat conductive material includes metallic foam, metallic foil, metallic gauze, or metallic felt.

Example 7 may include the subject matter of Example 6, wherein the flexible heat conductive material includes metallic foil having serpentine pattern fins.

Example 8 may include the subject matter of any one of Examples 1-7, wherein the block is a first block and the hydraulic force generator further comprises a second block, wherein the hydraulic bladder is to be positioned between the first block and the second block and the IC package is to be positioned between the second block and the system board.

Example 9 may include the subject matter of Example 8, wherein the IC package is a first IC package to be positioned between the second block and the system board, the hydraulic force generator further comprises a third block, a first region of the hydraulic bladder is to be positioned between the first block and the second block, and a second region of the hydraulic bladder is to be positioned between the first block and the third block to provide a force against a second IC package to be located between the third block of the hydraulic force generator and the system board.

Example 10 may include the subject matter of any one of Examples 2-9, wherein one or more of the first metal skin and the second metal skin have a thickness less than or equal to approximately 0.005 inches.

Example 11 may include the subject matter of Example 10, wherein one or more of the first metal skin and the second metal skin have a thickness of approximately 0.003 inches.

Example 12 may include the subject matter of any one of Examples 1-11, wherein the block is to be located on a first side of the system board and the hydraulic force generator further comprises a bolster plate to be located on a second side of the system board opposite the first side of the system board, wherein the block is to be fastened to the bolster plate through the system board.

Example 13 may include a computer system comprising: a system board; a socket coupled with the system board; an integrated circuit (IC) package having a plurality of interconnects coupled with the socket; and a hydraulic bladder to provide a force against a first side of the IC package such that a compressive force is maintained between a second side of the IC package and the socket.

Example 14 may include the subject matter of Example 13, further comprising a block, wherein the hydraulic bladder is to be located between the IC package and the block.

Example 15 may include the subject matter of Example 14, wherein the socket is on a first side of the system board and the computer system further comprises a bolster plate on a second side of the system board, wherein the block is to be fastened to the bolster plate through the system board.

Example 16 may include the subject matter of any one of Examples 14-15, further comprising a heat spreader plate having a cavity, wherein the IC package includes an IC die located within the cavity.

Example 17 may include the subject matter of Example 16, wherein the IC die is a first IC die, the cavity is a first cavity, the heat spreader plate includes a second cavity, and the IC package includes a second IC die located within the second cavity.

Example 18 may include the subject matter of Example 17, wherein the first IC die has a first height orthogonal to a plane of the system board, the second IC die has a second height orthogonal to the plane of the system board, and wherein the first height is different than the second height.

Example 19 may include the subject matter of any one of Examples 17-18, wherein the heat spreader plate has a first thickness in a first region around the first cavity and a second thickness in a second region around the second cavity, wherein the first thickness is different than the second thickness, wherein the hydraulic bladder includes a first hydraulic fitting and a second hydraulic fitting, wherein the first hydraulic fitting and the second hydraulic fitting are to be coupled to a pressurized liquid cooling system, and wherein the hydraulic bladder includes a flexible heat conductive material inside the hydraulic bladder that includes metallic foam, metallic foil, metallic gauze, or metallic felt.

Example 20 may include the subject matter of any one of Examples 13-19, wherein the IC package includes a central processing unit (CPU).

Example 21 may include the subject matter of any one of Examples 13-14, wherein the system board is a first system board, the socket is a first socket coupled with a first side of the first system board, the IC package is a first IC package, and the hydraulic bladder is a first hydraulic bladder, wherein the computer system further comprises: a second system board; a second socket coupled with the second system board; a second IC package having a plurality of interconnects to be coupled with the second socket; and a second hydraulic bladder to provide a force against a first side of the second IC package such that a compressive force is maintained between a second side of the second IC package and the second socket, wherein the second hydraulic bladder is between the second IC package and a second side of the first system board opposite the first side of the first system board.

Example 22 may include the subject matter of Example 21, further comprising one or more additional system boards, one or more additional sockets, one or more additional IC packages, and one or more additional hydraulic bladders in a stacked configuration with the first and second system boards, sockets, IC packages, and hydraulic bladders.

Example 23 may include the subject matter of any one of Examples 21-22, further comprising a plurality of fasteners, wherein each fastener of the plurality of fasteners extends through the first system board and the second system board.

Example 24 may include the subject matter of any one of Examples 13-23, wherein the IC package does not include an integrated heat spreader (IHS).

Example 25 may include a hydraulic bladder comprising: a first metal skin; a second metal skin welded to the first metal skin; a first hydraulic fitting and a second hydraulic fitting coupled with one or more of the first metal skin and the second metal skin, wherein the first and second hydraulic fittings are to be coupled to a pressurized liquid cooling system; and a flexible heat conductive material inside the hydraulic bladder.

Example 26 may include the subject matter of Example 25, wherein one or more of the first metal skin and the second metal skin are formed of stainless steel, copper, or aluminum.

Example 27 may include the subject matter of any one of Examples claims 25-26, wherein the flexible heat conductive material includes metallic foam, metallic foil, metallic gauze, or metallic felt.

Example 28 may include the subject matter of Example 27, wherein the flexible heat conductive material includes metallic foil having serpentine pattern fins.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second or third) for identified elements are used to distinguish between the elements, and do not indicate or imply a required or limited number of such elements, nor do they indicate a particular position or order of such elements unless otherwise specifically stated.

What is claimed is:

1. A hydraulic force generator comprising:
a first block to be coupled with a system board;
a second block, and a third block; and
a hydraulic bladder having a first region and a second region, wherein the first region is disposed between the first block and the second block to provide a force against a first integrated circuit (IC) package to be positioned between the second block and a system board;
wherein the second region is disposed between the first block and the third block to provide a force against a second IC package to be positioned between the third block and the system board; and wherein the hydraulic bladder, in response to pressurization, is to provide a force against the first IC package and the second IC package located between the hydraulic bladder and the system board.

2. The hydraulic force generator of claim 1, wherein the hydraulic bladder includes a first metal skin, a second metal skin coupled to the first metal skin, and a hydraulic fitting.

3. The hydraulic force generator of claim 2, wherein one or more of the first metal skin and the second metal skin are formed of stainless steel, copper, or aluminum.

4. The hydraulic force generator of claim 2, wherein the hydraulic fitting is a first hydraulic fitting and the hydraulic bladder includes a second hydraulic fitting, wherein the first hydraulic fitting and the second hydraulic fitting are to be coupled to a pressurized liquid cooling system.

5. The hydraulic force generator of claim 4, wherein the hydraulic bladder includes a flexible heat conductive material inside the hydraulic bladder.

6. The hydraulic force generator of claim 5, wherein the flexible heat conductive material includes metallic foam, metallic foil, metallic gauze, or metallic felt.

7. The hydraulic force generator of claim 6, wherein the flexible heat conductive material includes metallic foil having serpentine pattern fins.

8. The hydraulic force generator of claim 2, wherein one or more of the first metal skin and the second metal skin have a thickness less than or equal to approximately 0.005 inches.

9. The hydraulic force generator of claim 1, wherein the first block is to be located on a first side of the system board and the hydraulic force generator further comprises a bolster plate to be located on a second side of the system board opposite the first side of the system board, wherein the first block is to be fastened to the bolster plate through the system board.

10. A computer system comprising:
a first system board and a second system board;
a first socket coupled with the first system board and a second socket coupled with the second system board;
a first integrated circuit (IC) package having a plurality of interconnects coupled with the first socket and a second IC package having a plurality of interconnects coupled with the second socket;
a first hydraulic bladder to provide a force against a first side of the first IC package such that a compressive force is maintained between a second side of the IC package and the first socket; and
a second hydraulic bladder to provide a force against a first side of the second IC package such that a compressive force is maintained between a second side of the second IC package and the second socket, wherein the second hydraulic bladder is between the second IC package and a second side of the first system board opposite the first side of the first system board.

11. The computer system of claim 10, further comprising a block, wherein the first or second hydraulic bladder is to be located between the IC package and a first or a second block.

12. The computer system of claim 11, wherein the first or second socket is on a first side of the first or second system board and the computer system further comprises a bolster plate on a second side of the first or second system board, wherein the first or second block is to be fastened to the bolster plate through the first or second system board.

13. The computer system of claim 11, further comprising a heat spreader plate having a cavity, wherein the first or second IC package includes an IC die located within the cavity.

14. The computer system of claim 13, wherein the IC die is a first IC die, the cavity is a first cavity, the heat spreader plate includes a second cavity, and the IC package includes a third IC die located within the second cavity.

15. The computer system of claim 14, wherein the first IC die has a first height orthogonal to a plane of the first or second system board, a second IC die has a second height orthogonal to the plane of the first or second system board, and wherein the first height is different than the second height.

16. The computer system of claim 15, wherein the heat spreader plate has a first thickness in a first region around the first cavity and a second thickness in a second region around the second cavity, wherein the first thickness is different than the second thickness, wherein the first or second hydraulic bladder includes a first hydraulic fitting and a second hydraulic fitting, wherein the first hydraulic fitting and the second hydraulic fitting are to be coupled to a pressurized liquid cooling system, and wherein the hydraulic bladder includes a flexible heat conductive material inside the hydraulic bladder that includes metallic foam, metallic foil, metallic gauze, or metallic felt.

17. The computer system of claim 10, further comprising one or more additional system boards, one or more additional sockets, one or more additional IC packages, and one or more additional hydraulic bladders in a stacked configuration with the first and second system boards, sockets, IC packages, and hydraulic bladders to form a stacked cluster.

18. The computer system of claim 10, further comprising a plurality of fasteners, wherein each fastener of the plurality of fasteners extends through the first system board and the second system board to hold them together.

* * * * *